United States Patent
Hu et al.

(10) Patent No.: US 11,127,524 B2
(45) Date of Patent: Sep. 21, 2021

(54) POWER CONVERTER

(71) Applicant: Hong Kong Applied Science and Technology Research Institute Company Limited, Hong Kong (CN)

(72) Inventors: Xiaoyong Hu, Shenzhen (CN); Ziyang Gao, Hong Kong (CN); Zhou Li, Hong Kong (CN)

(73) Assignee: Hong Kong Applied Science and Technology Research Institute Company Limited, Hong Kong (CN)

( * ) Notice: Subject to any disclaimer, the term of this patent is extended or adjusted under 35 U.S.C. 154(b) by 304 days.

(21) Appl. No.: 16/219,982

(22) Filed: Dec. 14, 2018

(65) Prior Publication Data
US 2020/0194161 A1    Jun. 18, 2020

(51) Int. Cl.
| | |
|---|---|
| *H01F 27/24* | (2006.01) |
| *H01F 27/28* | (2006.01) |
| *H05K 1/16* | (2006.01) |
| *H01F 27/02* | (2006.01) |
| *H01F 1/12* | (2006.01) |
| *H01F 38/00* | (2006.01) |

(52) U.S. Cl.
CPC .......... *H01F 27/2804* (2013.01); *H01F 1/12* (2013.01); *H01F 27/022* (2013.01); *H01F 27/24* (2013.01); *H05K 1/165* (2013.01); *H01F 38/00* (2013.01)

(58) Field of Classification Search
CPC ...... H01F 27/2804; H01F 27/022; H01F 1/12; H01F 27/24; H01F 38/00; H01F 27/40; H01F 3/10; H01F 27/2847; H01F 2017/048; H01F 2003/106; H01F 17/04; H01F 17/0006; H01F 17/0013; H01F 2017/0073; H01F 27/2809; H01F 27/255; H05K 1/165; H05K 1/0263; H05K 2201/10166; H05K 2201/086; H05K 3/284

See application file for complete search history.

(56) References Cited

U.S. PATENT DOCUMENTS

| | | | |
|---|---|---|---|
| 5,350,628 A | 9/1994 | Kugimiya et al. | |
| 6,888,435 B2 | 5/2005 | Inoue et al. | |
| 7,064,643 B2 * | 6/2006 | Matsutani | H01F 17/04 336/192 |
| 8,704,108 B2 | 4/2014 | Schaible et al. | |
| 9,230,728 B2 * | 1/2016 | Liu | H01F 1/14766 |
| 9,558,878 B1 | 1/2017 | Abu-Qahouq | |

(Continued)

FOREIGN PATENT DOCUMENTS

| | | |
|---|---|---|
| CN | 102005279 | 4/2011 |
| CN | 104160513 | 11/2014 |

(Continued)

*Primary Examiner* — Mang Tin Bik Lian
(74) *Attorney, Agent, or Firm* — Eagle IP Limited; Jacqueline C. Lui

(57) ABSTRACT

An assembly for power converting includes a circuit board, a power switching circuit mounted on the circuit board, an inductor coil that includes a winding and two ends, a magnetic core that is surrounded by the winding of the inductor coil, and a magnetic mixture that encapsulates the circuit board, the power switching circuit, the inductor coil and the magnetic core. The winding of the inductor coil is stacked above the power switching circuit and is sufficiently large to fill up a size of the assembly.

13 Claims, 7 Drawing Sheets

(56) References Cited

U.S. PATENT DOCUMENTS

| | | | | |
|---|---|---|---|---|
| 2006/0038651 A1* | 2/2006 | Mizushima | ............ | H01F 17/04 336/83 |
| 2008/0248245 A1* | 10/2008 | Maeda | ............ | H01F 3/08 428/144 |
| 2009/0002117 A1* | 1/2009 | Kawarai | ............ | H01F 17/04 336/233 |
| 2011/0005064 A1* | 1/2011 | Klesyk | ............ | H01F 27/24 29/605 |
| 2011/0228507 A1* | 9/2011 | Yin | ............ | H01L 23/49531 361/811 |
| 2011/0242775 A1* | 10/2011 | Schaible | ............ | H01F 17/04 361/752 |
| 2013/0228717 A1* | 9/2013 | Harada | ............ | H01F 1/26 252/62.55 |
| 2013/0300531 A1* | 11/2013 | Tsuchiya | ............ | C22C 38/00 336/221 |
| 2014/0184374 A1* | 7/2014 | Park | ............ | H01F 17/0013 336/83 |
| 2016/0005520 A1* | 1/2016 | Cheng | ............ | H01F 27/04 336/90 |
| 2017/0223834 A1* | 8/2017 | Huang | ............ | H05K 1/181 |
| 2018/0205323 A1* | 7/2018 | Cai | ............ | H01F 27/29 |
| 2018/0332731 A1* | 11/2018 | Kita | ............ | H01F 27/025 |
| 2019/0051445 A1* | 2/2019 | Wada | ............ | H01F 27/2804 |
| 2020/0105447 A1* | 4/2020 | Nakajima | ............ | H01F 1/14791 |
| 2020/0152372 A1* | 5/2020 | Wei | ............ | H01F 27/29 |

FOREIGN PATENT DOCUMENTS

| | | |
|---|---|---|
| CN | 102790513 | 12/2014 |
| CN | 102256443 | 12/2015 |
| CN | 102857088 | 1/2016 |
| CN | 106024764 | 10/2016 |
| CN | 108235572 | 6/2018 |
| JP | 0982525 | 3/1997 |

* cited by examiner

POWER CONVERTER

FIELD OF INVENTION

This invention relates to an electronic device, and in particular a power converter.

BACKGROUND OF INVENTION

The performance of conventional or existing power converters are far below the industry's expectation with the increasing demands for computing and telecommunication systems. New power converter with improved performance will assist in advancing the technology and meet the needs of industrial applications.

SUMMARY OF INVENTION

One example embodiment is an assembly for power converting. The assembly includes a circuit board, a power switching circuit mounted on the circuit board, an inductor coil that includes a winding and two ends, a magnetic core that is surrounded by the winding of the inductor coil, and a magnetic mixture that encapsulates the circuit board, the power switching circuit, the inductor coil and the magnetic core. The winding of the inductor coil is stacked above the power switching circuit and the two ends connect to the power switching circuit.

Another example embodiment is a power converter. The power converter includes a circuit board, an inductor coil that is stacked parallel to a surface of the circuit board and above all electronic components on the circuit board, a magnetic core that is surrounded by the inductor coil and a magnetic mixture that encapsulates the inductor coil and the magnetic core on the circuit board. The inductor coil, the magnetic mixture and the magnetic core form an inductor.

Another example embodiment is an integrated inductor that includes an inductor coil, a magnetic core and a magnetic mixture for encapsulation. The inductor coil includes a plurality of turns that are winded and stacked on each other along an axis. The magnetic core in the center of the inductor coil along the axis. The magnetic mixture encapsulates the inductor coil and the magnetic core to form a magnetic composite body. The magnetic mixture includes at least two types of magnetic particles that are of different sizes and a bonding material.

Other example embodiments are discussion herein.

DETAILED DESCRIPTION

Figure 1:
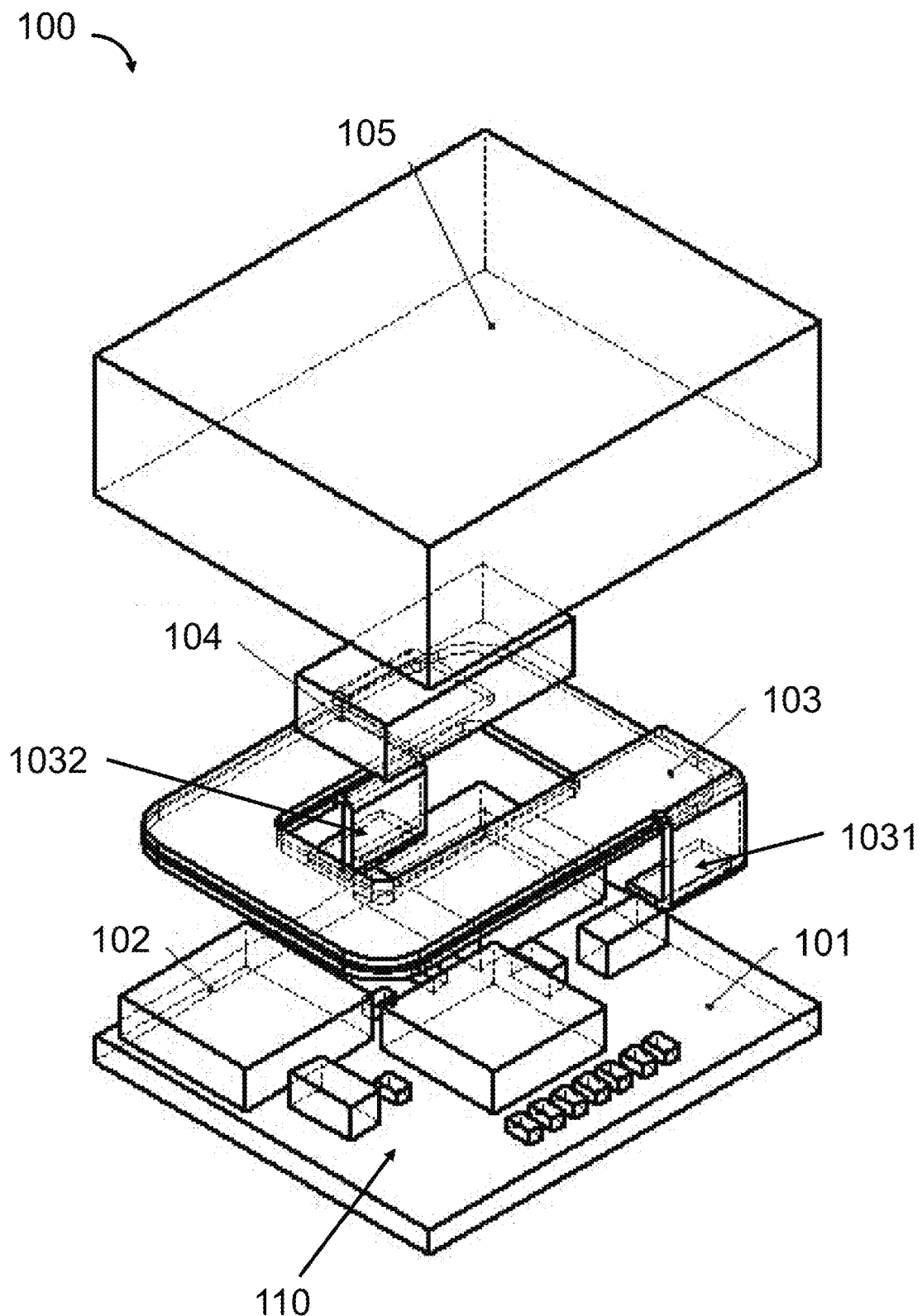
FIG. 1 is an exploded view of a power converter in accordance with an example embodiment.

As used herein and in the claims, "couple" or "connect" refers to electrical coupling or connection either directly or indirectly via one or more electrical means unless otherwise stated.

As used herein, "point-of-load converter" is an example of power module of non-isolated DC/DC type for providing power directly to the load.

As used herein, "power density" refers to the amount of power per unit volume.

As used herein, "soft magnet" refers to soft magnetic materials that are easily magnetized and demagnetized. They typically have intrinsic coercivity less than 1000 $Am^{-1}$. They are used primarily to enhance and/or channel the flux produced by an electric current. The main parameter, often used as a figure of merit for soft magnetic materials, is the relative permeability $\mu_r$, where $\mu_r=B/\mu_0H$, B is magnetic field, H is magnetic field strength and $\mu_0$ is magnetic constant, which is a measure of how readily the material responds to the applied magnetic field. Soft magnetic materials that are recommended to be used in the example embodiments are: ferrite, molypermalloy powder, glassy alloy magnetic materials, Fe—Si—Al magnetic powder, etc.

In applications such as telecommunication equipment, data center, medical, military, point-of-load converters are the key components that provide power directly to the load, such as CPU, GPU, FPGA, etc. Example embodiments consider electronic efficiency, power density, magnetic power loss, and thermal conductivity to improve the performance of the point-of-load converters to provide small, highly efficient, lightweight form factors, on-board power converters.

The major sources of power loss in the power converters are the transistors and inductors, each of which contributes about 45% of the power loss. The loss energy is converted into heat, resulting in an adverse effect of temperature increase of the sources and the surrounding area. To include more switching devices in the power converter can reduce the power loss. However, as one of the largest components in a power converter module, the inductor occupies a large portion of surface area of the printed circuit board (PCB) that limits the flexibility and restrict options in the design of the PCB layout.

Example embodiments provide novel 3D package structure and packaging method for a power converter to improve the power density and efficiency of the power converter. Example embodiments scheme an unconventional way to design, arrange and encapsulate an inductor inside a power converter with minimal increase in the package thickness but significant improvement in performance.

Example embodiments provide a power converter having an inductor coil stacked above all the components mounted on a substrate so that more space is released for accommodating a large winding of the inductor coil that fills up a size of the power converter, for accommodating more switching devices on the substrate, for pre-implanting a magnetic core inside the inductor coil and for encapsulating the inductor coil using a magnetic mixture to form a magnetic composite body. By way of example, comparing to a benchmark design in which there are two switching devices, example embodiment is able to have three switching devices, thus the power density of the power converter of the example embodiment can be improved 50% comparing with a benchmark design. By forming the magnetic composite body, a shorter magnetic path is provided for the winding. The high thermal conductivity of the magnetic mixture and the large winding can reduce thermal resistance and power loss by 30%. By pre-implanting a magnetic core, the inductance of the inductor is improved. An optimized inductance of the inductor can be obtained by tuning the size and shape of the pre-planted magnetic core according to different design requirement.

Example embodiments show an integrated power electronic package that has higher power density and higher efficiency with similar packaging cost compared to the existing power converter. The integrated power electronic package includes a power switching circuit consisting of more components, such as more power management controller IC, switching IC, and other passive components than the package of a same size of a conventional power converter. Example embodiments of the present invention overcome the difficulty in combining an inductor coil, a magnetic core and an encapsulation composed of the mixture of at least one type of magnetic material and the bonding material to form an inductor composite above the switching circuit on the PCB, thus providing improved inductance control of the inductor, temperature effect of the magnetic materials and thermal performance of the power converter module.

The following example embodiments alone or in combination may be practiced to provide an integrated inductor, a power converter, and/or an assembly for converting power.

FIG. 1 shows an exploded view of a power converter 100 in accordance with an example embodiment.

In FIG. 1, the power converter 100 includes a circuit board 101, electronic components 110, an inductor coil 103, a magnetic core 104, and a magnetic mixture 105. The electronic components 110 are mounted on the circuit board 101, which include an IC 102. When the power converter 100 is in use, the inductor coil 103 is positioned above the circuit board 101 and all the electronic components 110 thereon, the magnetic core 104 is surrounded by the inductor coil 103, and the magnetic mixture 105 encapsulates the electronic components 110, the inductor coil 103 and the magnetic core 104 on the circuit board 101.

In one example embodiment, the magnetic mixture 105 includes at least one type of magnetic material and a bonding material. For example, the bonding material is epoxy.

In one example embodiment, the magnetic mixture 105 includes at least two types of magnetic particles that are of different sizes.

In one example embodiment, the electronic components 110 include at least one power management controller device and at least one switching device.

In one example embodiment, the magnetic core 104 is a soft magnet. The magnetic core 104 works as a tuner for the inductance control as the permeability of the magnetic mixture 105 is lower than pure magnets, i.e. different inductance may be achieved by enclosing magnetic core of different size and different shape according to the design requirement.

In one example embodiment, the inductor coil 103, the magnetic core 104 and the magnetic mixture 105 form an inductor. The inductor coil 103 has two ends 1031 and 1032 that connect to the electronic components 110, as shown in FIG. 1 and FIG. 2.

Figure 2:
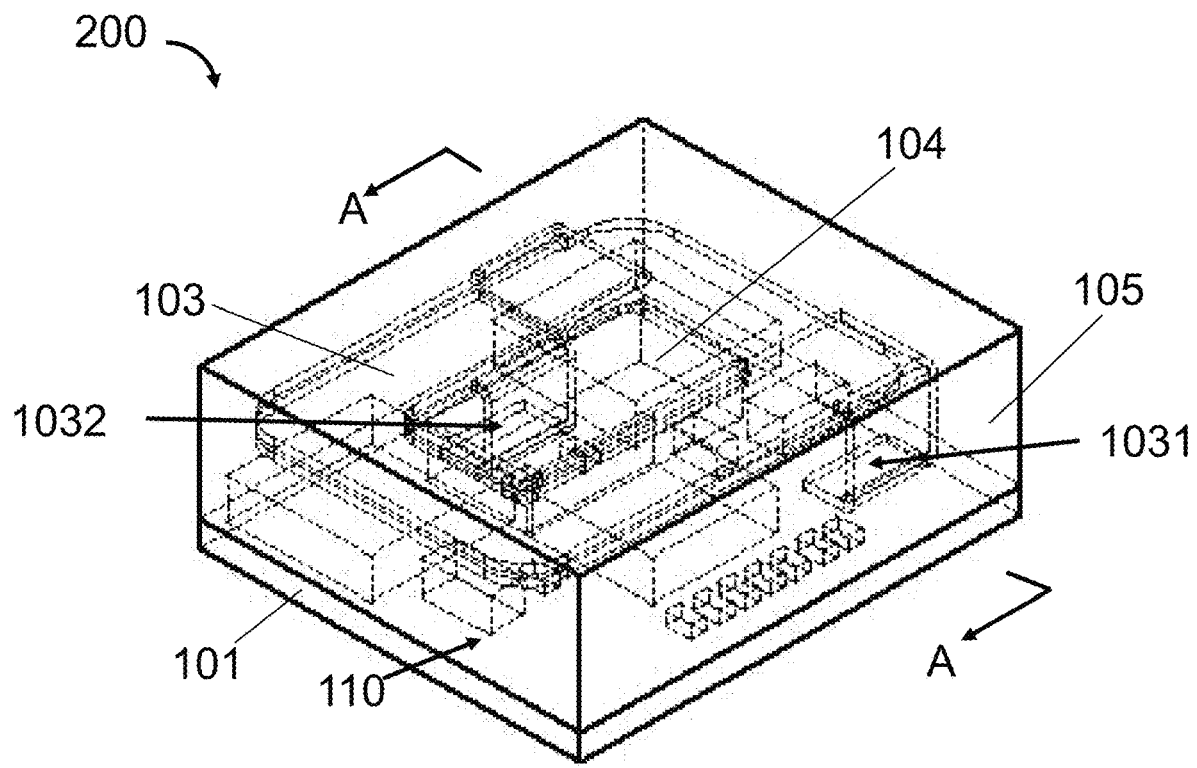
FIG. 2 is a perspective view of an assembled power converter in accordance with an example embodiment.
Figure 3:
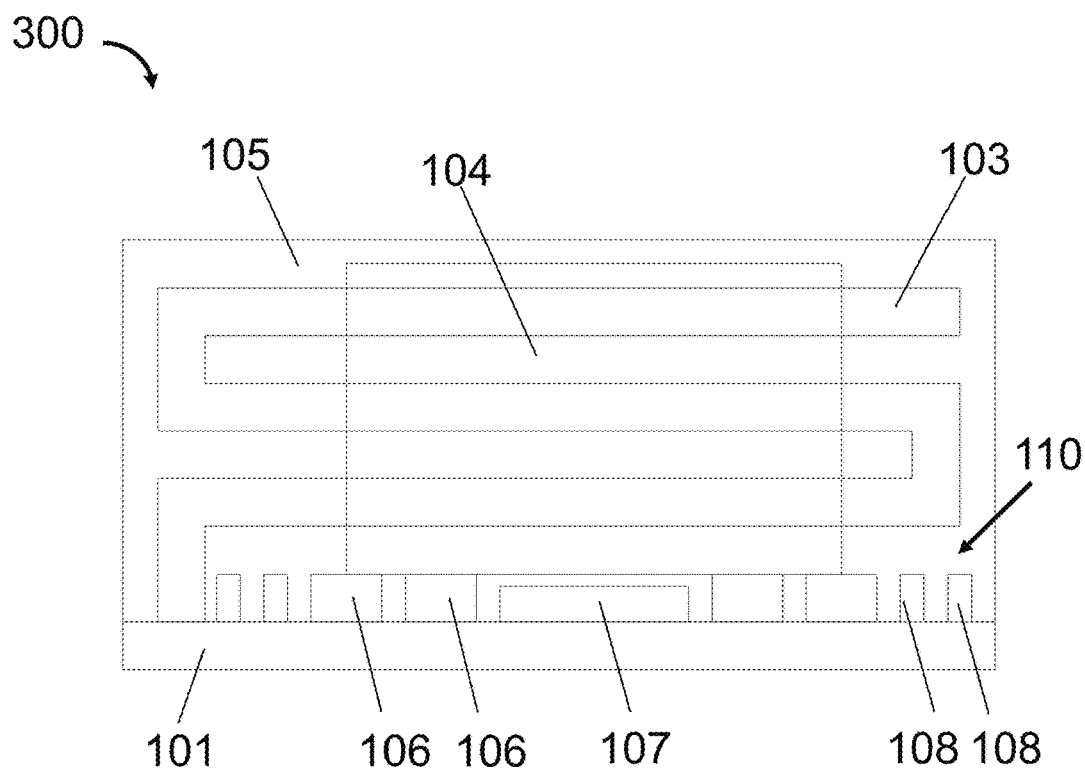
FIG. 3 is a cross section view of the power converter in FIG. 2 along the line A-A in accordance with an example embodiment.

FIG. 2 shows a perspective view of an assembled power converter 200 in accordance with an example embodiment. FIG. 3 shows a cross-section view of the power converter in FIG. 2 along A-A line.

In FIG. 2 and FIG. 3, the inductor coil 103 is positioned above the electronic components 110 connected on the circuit board 101. The magnetic core 104 is surrounded by the inductor coil 103. The electronic components 110, the inductor coil 103, and the magnetic core 104 are encapsulated by the magnetic mixture 105 on the circuit board 101.

In one example embodiment, the electronic components 110 includes switching devices and drivers 106, controllers 107, and capacitors, resistors and sensors 108.

In one example embodiment, the electronic components 110 may include one, two, four or more switching devices.

In one example embodiment, the controllers 107 include a power management controller.

In one example embodiment, the inductor coil 103 is stacked parallel to a surface of the circuit board 101 above the electronic components 110 on the circuit board 101.

FIG. 4A-FIG. 4F show example embodiments of the inductor coil, which is to be mounted above all or a part of the electronic components on the circuit board of a power converter to fully occupy a size of the power converter.

Figure 4A:
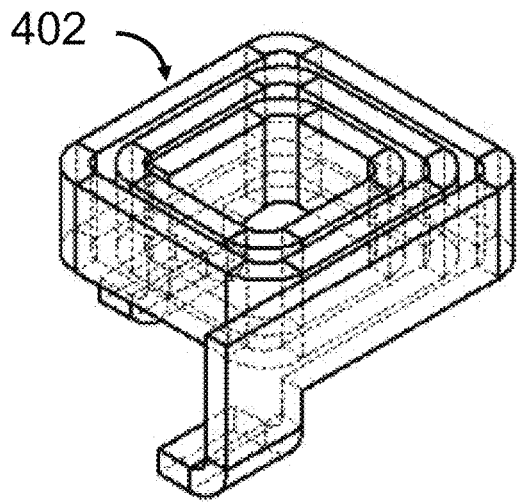
FIG. 4A shows a perspective view of an inductor coil in accordance with an example embodiment.
Figure 4B:
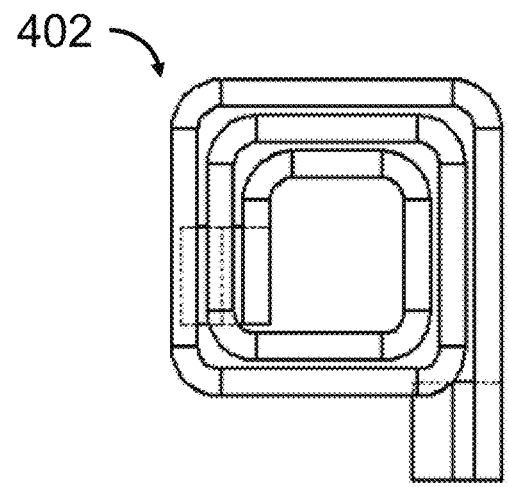
FIG. 4B shows a top view of the inductor coil in FIG. 4A in accordance with an example embodiment.
Figure 4C:
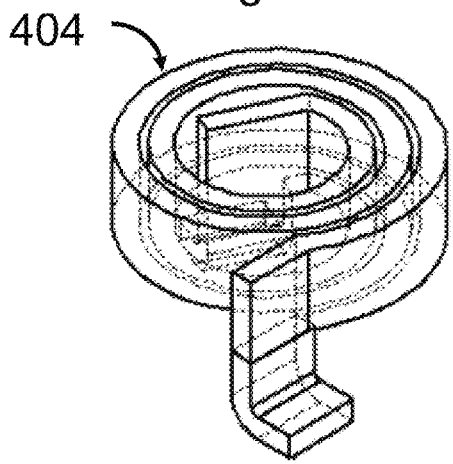
FIG. 4C shows a perspective view of an inductor coil in accordance with an example embodiment.
Figure 4D:
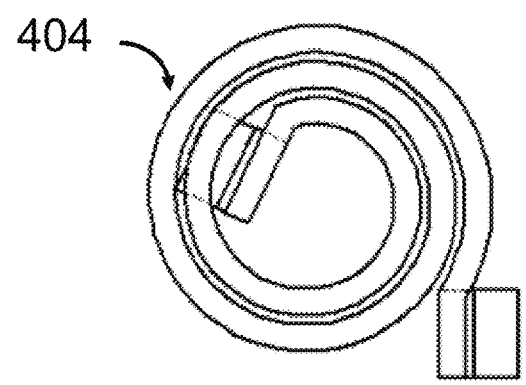
FIG. 4D shows a top view of the inductor coil in FIG. 4C in accordance with an example embodiment.
Figure 4E:
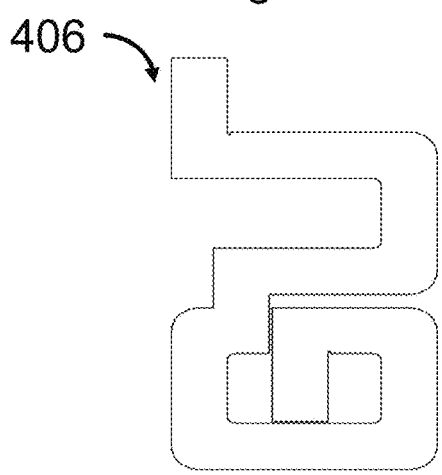
FIG. 4E shows an inductor coil in accordance with an example embodiment.
Figure 4F:
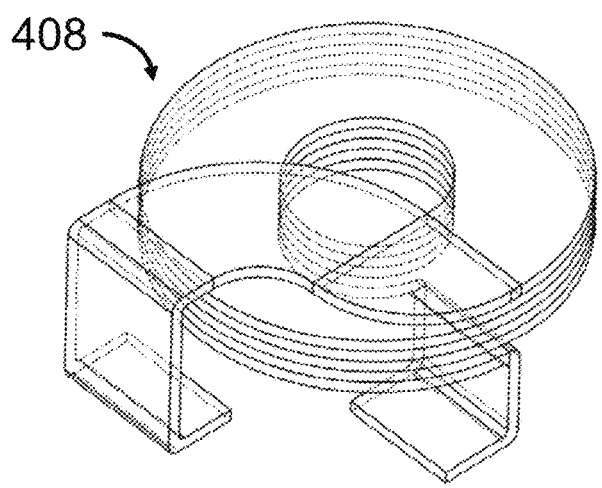
FIG. 4F shows a perspective view of an inductor coil in accordance with an example embodiment.

FIG. 4A shows a perspective view of an inductor coil 402 having a thickness in the axial direction. FIG. 4B shows a top view of the inductor coil 402 which is a rectangular pancake coil, i.e. a coil winded in a flat rectangular shape includes a plurality of adjoining winding turns. FIG. 4C shows a perspective view of an inductor coil 404 having a thickness in the axial direction. FIG. 4D shows a top view of the inductor coil 404 which is a circular pancake coil, i.e. a coil winded in a flat circular shape includes a plurality of adjoining winding turns. FIG. 4E shows an inductor coil 406 with a curve-shaped winding that is foldable. FIG. 4F shows an inductor coil 408 including a plurality of identical circular turns that are superposed on each other along an axis. By way of example, the circular turns of the inductor coil 408 are closely packed so that the size of the power converter using the inductor coil 408 can be minimized. Each of the inductor coil 402, 404, 406 and 408 has two ends that are to be coupled with other electronic components on a circuit board, and each of the inductor coil 402, 404, 406 and 408 encloses a space for receiving a magnetic core. In addition, each of the inductor coil 402, 404, 406 and 408 is sufficiently large to fill up a size of an assembly, i.e. the inductor coil 402, 404, 406 and 408 can be as large as possible and limited by the boundary of the assembly.

As the 3D stacking arrangement of the inductor coil saves planar space on the circuit board, example embodiments can achieve less conduction and switching loss by including more switching devices, e.g. MOSFET switches in the power converter. For example, at input voltage of 5V, output voltage of 1.8V, output current of 20 A, the total switching loss for a power converter with two MOSFET switches is around 1.8 W, while the total switching loss reduces to less than 1.1 W for a power converter with four MOSFET switches. The loss reduction is around 40%.

The 3D stacking arrangement of the inductor coil also enables a larger inductor winding and a thicker wire in the winding comparing with an on-board inductor, so that example embodiments can achieve less magnetic power loss. By way of example, the resistance of the inductor coil $R_{dc}$ is calculated by:

$$R_{dc} = \rho_{Cu} Lth_w / A_w \qquad (1)$$

wherein $\rho_{Cu}$ is the resistivity of the wire in the winding, $Lth_w$ is the length of the wire, and $A_w$ is the cross-sectional area of the wire. According to equation (1), when $A_w$ increases, $R_{dc}$ decreases, which means less energy is wasted on the resistance of the inductor by using a thicker wire, such as a flat copper wire. Moreover, the core loss $P_{core}$ in the inductor increases with the peak magnetic flux density in the core, and the peak magnetic flux density in the core is inversely proportional to the equivalent area $A_e$ of the core. Therefore when $A_e$ increases, $P_{core}$ decreases, which means a larger inductor coil will lead to less magnetic loss.

In one example embodiment, the magnetic loss reduces about 50% comparing with a conventional design of the inductor of a conventional power converter.

The power efficiency of a power converter can be expressed as follows:

$$\text{Power efficiency} = \text{output power/input power} \qquad (4)$$

$$\text{Power loss} = \text{input power} - \text{output power} \qquad (5)$$

According to equation (4) and (5), the reduction of the power loss leads to increase of the power efficiency for the power converter.

Figure 5A:
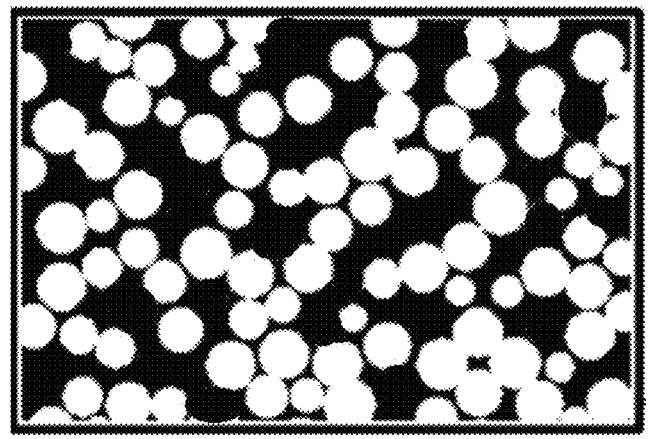
FIG. 5A shows a magnetic mixture in accordance with an example embodiment.
Figure 5B:
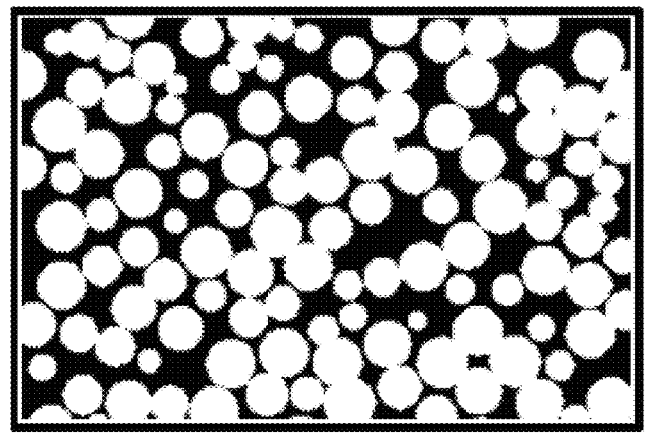
FIG. 5B shows a magnetic mixture in accordance with an example embodiment.
Figure 5C:
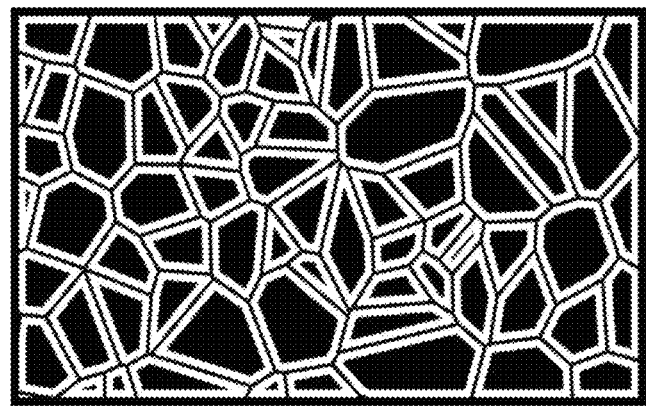
FIG. 5C shows a magnetic mixture in accordance with an example embodiment.

FIG. 5A-FIG. 5C shows example embodiments of the magnetic mixtures 500A, 500B, and 500C.

In the magnetic mixtures shown in FIG. 5A and FIG. 5B, the white dots represent particles of one or more magnetic materials and the black part represents the bonding material. In FIG. 5C, the black pieces represent the magnetic particles that are bonded by the bonding material shown in white. The magnetic particles in FIG. 5B are more highly packed than the magnetic particles in FIG. 5A, while the magnetic particles in FIG. 5C are fully packed in the power converter and have the highest package density.

In one example embodiment, the magnetic mixture includes spherical soft magnetic particles that are of the same size and same material. In another example embodiment, the magnetic mixture includes spherical soft magnetic particles that have two or more sizes to increase the packing density. In further another example embodiment, the magnetic mixture includes polyhedral soft magnetic particles that are of different sizes and shapes and fit with each other to achieve a highest package density. In one example embodiment, the magnetic particles are made of two or more soft magnetic materials. The properties of the magnetic mixture such as the permeability, thermal conductivity, temperature effect and core loss are related to the size, shape, and magnetic materials of the magnetic particles, as well as the volume ratio of the magnetic materials and the bonding material. The purpose is to control the inductance to a pre-determined value according to design specifications.

In one example embodiment, the magnetic particles are provided by grinding one or more raw magnetic materials into magnetic powders. The magnetic powders are then filtered to obtain magnetic particles that are of a particular size. After that, the filtered magnetic particles are mixed with certain epoxy by a pre-determined volume ratio into a magnetic mixture. Finally, a magnetic composite body which includes the magnetic mixture, the inductor coil and the magnetic core is formed by potting the magnetic mixture into an encapsulating frame that encapsulates the inductor coil and the magnetic core and curing it to a solid state, for example, by heating.

In one example embodiment, the soft magnetic particles are in micrometer scale or smaller.

In one example embodiment, the volume ratio of solid magnetic particles to liquid bonding material ranges from 1:3 to 3:1 depending on different process parameters. The volume ratio or weight ratio of solid magnetic particles of more than 1 type ranges from 1:2 to 2:1 depending on different configurations.

Figure 6:
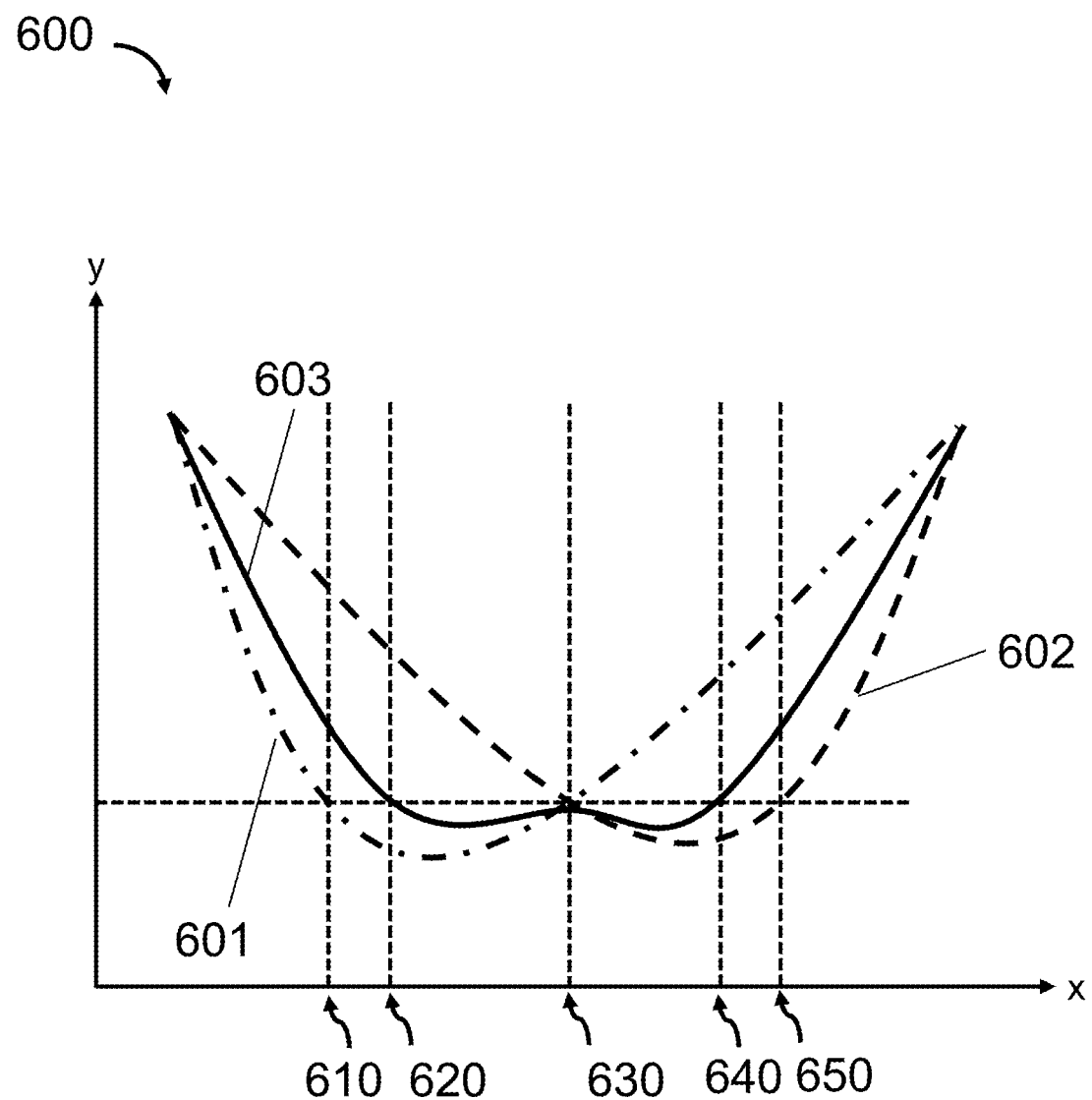
FIG. 6 shows characteristic curves of magnetic materials in accordance with an example embodiment.

FIG. 6 is a graph 600 showing characteristic curves of magnetic materials. In FIG. 6, the x-axis is the temperature, and the y-axis is the core loss of the magnetic material. The line 601 shows the characteristic of one magnetic material that has a low core loss at a relatively low temperature, for example at temperature 610 to 630. The line 602 shows the characteristic of another magnetic material that has a low core loss at a relatively high temperature, for example, at temperature 630 to 650. The line 603 shows the characteristic of a magnetic mixture obtained by combining both materials. As shown in FIG. 6, the magnetic mixture has a much wider working temperature range than each individual magnetic material, i.e. from temperature 620 to temperature 640.

In an example embodiment, the magnetic mixture may be customized by combining different magnetic materials with different volume ratio according to the application requirement.

Figure 7A:
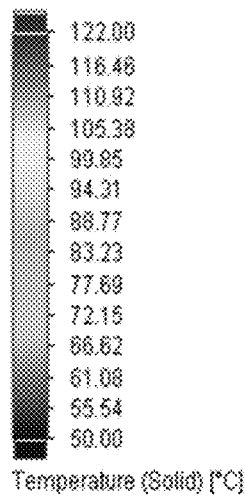
FIG. 7A shows a temperature distribution inside a benchmark package.
Figure 7A:
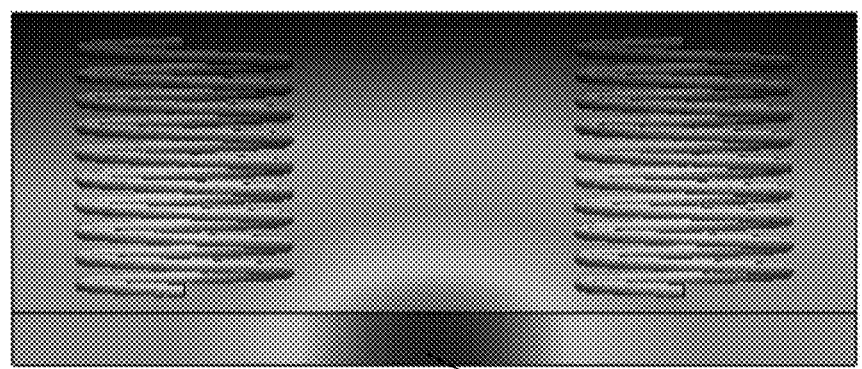
Figure 7B:
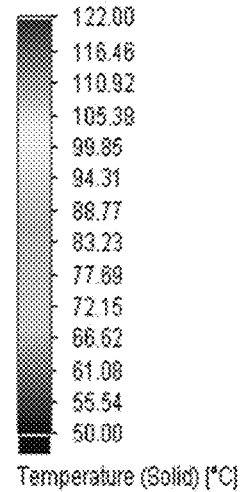
FIG. 7B shows a temperature distribution inside a power converter package in accordance with an example embodiment.
Figure 7B:
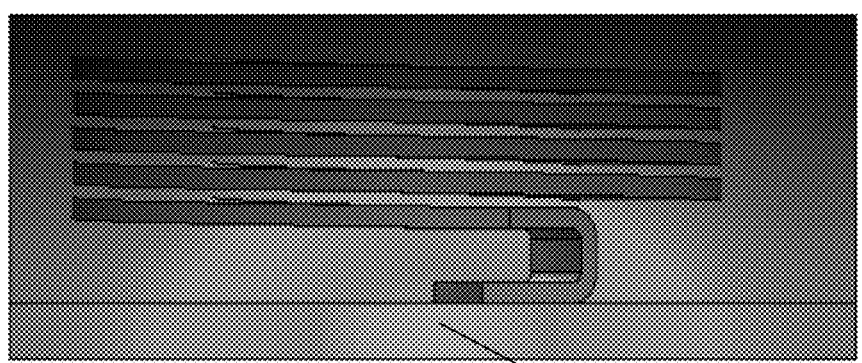

FIG. 7A and FIG. 7B are graphs 700A and 700B showing the simulated temperature distributions of the power converter packages of a benchmark and of an example embodiment respectively.

In 700A, two conventional inductors are mounted on the circuit board in a conventional way. In 700B, one 3D stacking inductor coil is connected to the circuit board and encapsulated by a magnetic mixture. The thermal boundary conditions in two simulations are the same, i.e applying a constant temperature surface of 50° C. on the top surface of both packages. Since by definition $R = \Delta T/P$, where P is the heat power (i.e. power loss) and R is the thermal resistance, thus $\Delta T = P \cdot R$, in which $\Delta T$ is a function of power loss P and thermal resistance R. For 700A and 700B, P is assumed to be the same, therefore $\Delta T$ is only determined by the thermal resistance R. Since the thermal resistance of current invention is much lower (30% lower) than that of the benchmark converter, the simulated $\Delta T$ of the example embodiment is lower than that of the benchmark converter.

Both inductors in 700A and 700B are activated and the temperature distribution are illustrated in FIG. 7A and FIG. 7B. In 700A, the highest temperature in the center of the circuit board 701A is around 122° C., while in 700B, the highest temperature in the center of the circuit board 701B is around 100° C., which is much lower. The temperature distribution shows that the example embodiment has a less power loss due to the large winding, and high thermal conductivity magnetic mixture encapsulation.

Figure 8:
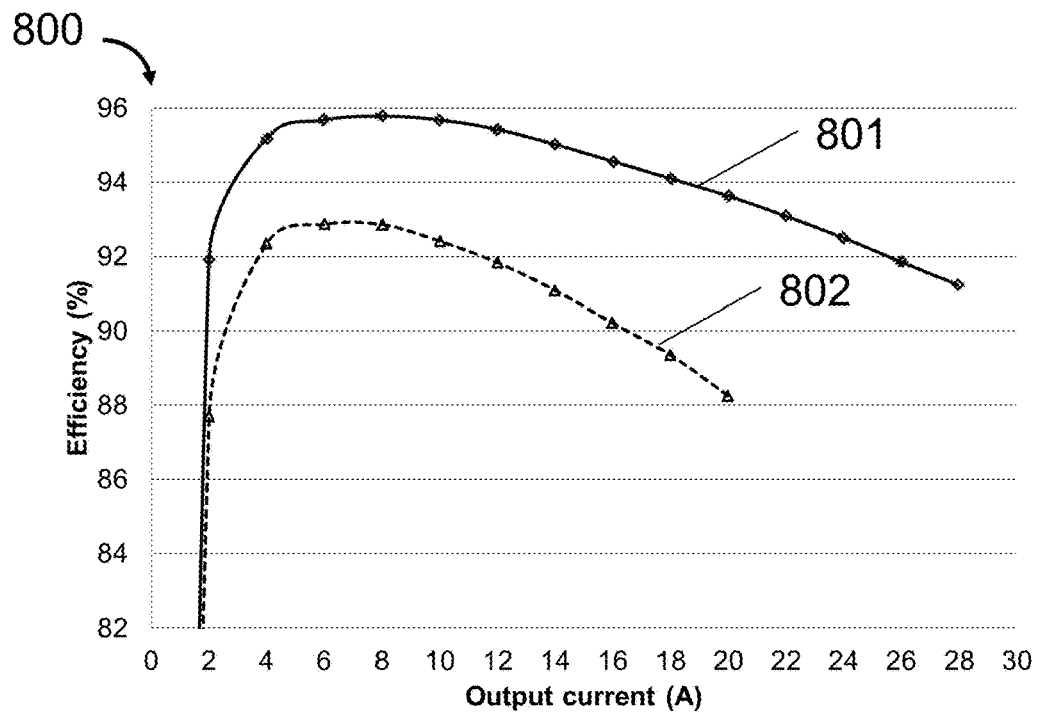
FIG. 8 shows relationship between the efficiency and output current of a power converter in accordance with an example embodiment.

FIG. 8 is a graph 800 showing relationship between the efficiency (%) and output current (A) of a power converter in accordance with an example embodiment.

In FIG. 8, the curve 801 is obtained from the power converter of an example embodiment. The curve 802 is the benchmark data. By way of example, a DC voltage of 5V is applied to both converters and the output voltage is adjusted to 1.8V. As can be seen, the efficiency of power converter in the example embodiment is higher than that of the benchmark power converter at all output current level. The highest efficiency of the power converter in the example embodiment is about 96%, while the highest efficiency for the benchmark is around 93%. And the difference of efficiency therebetween increases with the output current. Furthermore, the maximum output current for the benchmark is 20 A, while the output current for the example embodiment can reach as large as 28 A.

Figure 9:
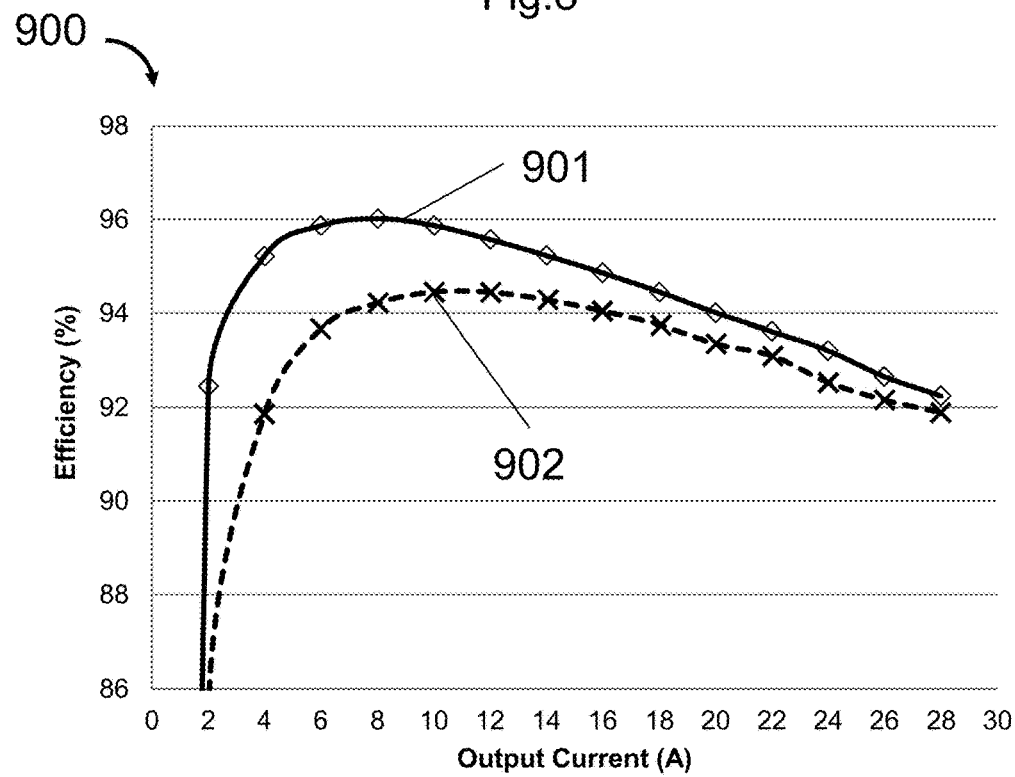
FIG. 9 shows relationship between the efficiency and output current of a power converter with or without magnetic core in accordance with an example embodiment.

FIG. 9 is a graph 900 showing a relationship between the efficiency (%) and output current (A) of a power converter with or without magnetic core in accordance with an example embodiment.

In FIG. 9, the curve 901 is obtained from a power converter of an example embodiment with a magnetic core, and the curve 902 is obtained from the power converter without a magnetic core. As shown in graph 900, the implanting of the magnetic core leads to an increase of the power efficiency at all output currents, from 2 A to 28 A.

The exemplary embodiments of the present invention are thus fully described. Although the description referred to particular embodiments, it will be clear to one skilled in the art that the present invention may be practiced with variation of these specific details. Hence this invention should not be construed as limited to the embodiments set forth herein.

For example, although the shape of the inductor coil is described as in FIG. 4A to FIG. 4F above, but it is clear that other shapes and sizes may be used according to the user's preference.

What is claimed is:

1. An assembly for power converting, comprising:
a circuit board;
electronic components mounted on the circuit board;
an inductor coil including a winding and two ends, wherein the winding of the inductor coil is stacked above the electronic components and the two ends connect to the electronic components, and the winding is sufficiently large to fully occupy fill up a size of the assembly;
at least a magnetic core that is surrounded by the winding of the inductor coil; and
a magnetic mixture that encapsulates the circuit board, the electronic components, the inductor coil and the magnetic core, wherein the magnetic mixture includes polyhedral soft magnetic particles that are of different sizes and shapes and fit with each other to achieve a high package density, and wherein the magnetic mixture includes at least one type of soft magnetic material and a bonding material, and the magnetic core is a soft magnet, the soft magnet is selected from a group consisting of ferrite, molypermalloy powder, glassy alloy magnetic materials, Fe—Si—Al magnetic powder.

2. The assembly of claim 1, wherein the magnetic mixture includes at least two types of soft magnetic particles that are of different sizes.

3. The assembly of claim 1, wherein the electronic components include at least three switching devices.

4. A power converter, comprising:
a circuit board;
an inductor coil that is stacked parallel to a surface of the circuit board and above all electronic components on the circuit board, wherein the inductor coil is sufficiently large to fully occupy the power converter;
at least a magnetic core that is surrounded by the inductor coil; and
a magnetic mixture that encapsulates the inductor coil and the magnetic core on the circuit board, wherein the magnetic mixture includes polyhedral soft magnetic particles that are of different sizes and shapes and fit with each other to achieve a high package density,
wherein the inductor coil, the magnetic mixture and the magnetic core form an inductor, and wherein the magnetic mixture includes at least one type of soft magnetic material and a bonding material, and the magnetic core is a soft magnet, the soft magnet is selected from a group consisting of ferrite, molypermalloy powder, glassy alloy magnetic materials, Fe—Si—Al magnetic powder.

5. The power converter of claim 4, wherein the electronic components include at least three switching devices.

6. The power converter of claim 4, wherein the inductor coil includes a plurality of identical turns that are superposed on each other and parallel to the surface of the circuit board and enclose a space to receive the magnetic core.

7. The power converter of claim 4, wherein the magnetic mixture includes at least two types of soft magnetic particles that are of different sizes.

8. The power converter of claim 4, wherein the magnetic mixture includes soft magnetic particles in micrometer scale or smaller.

9. An integrated inductor, comprising:
an inductor coil including a plurality of turns that are winded and stacked on each other along an axis;
at least a magnetic core in the center of the inductor coil along the axis; and
a magnetic mixture that encapsulates the inductor coil and the magnetic core to form a magnetic composite body,
wherein the inductor coil is sufficiently large to fully occupy the integrated inductor, and wherein the magnetic mixture includes at least two types of soft magnetic particles that are of different sizes and a bonding material, wherein the soft magnetic particles include polyhedral soft magnetic particles that are of different sizes and shapes and fit with each other to achieve a high package density, and wherein the magnetic core is a soft magnet, the soft magnet is selected from a group consisting of ferrite, molypermalloy powder, glassy alloy magnetic materials, Fe—Si—Al magnetic powder.

10. The integrated inductor of claim 9, wherein the soft magnetic particles are provided by grinding of at least one type of raw magnetic material.

11. The integrated inductor of claim 9, wherein the magnetic composite body is formed by potting the magnetic mixture into an encapsulation frame and curing the magnetic mixture to a solid state by heating.

12. The integrated inductor of claim 9, wherein the integrated inductor is mounted on a circuit board of a power converter with at least one switching device in between.

13. The integrated inductor of claim 9, wherein the at least two types of soft magnetic particles are ranging from 1:2 to 2:1 volume ratio and the soft magnetic particles to bonding material are ranging from 1:3 to 3:1 volume ratio.

* * * * *